(12) United States Patent
Watanabe et al.

(10) Patent No.: US 8,537,935 B2
(45) Date of Patent: Sep. 17, 2013

(54) CLOCK DATA RECOVERY CIRCUIT AND METHOD

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 863 days.

(21) Appl. No.: 12/532,132

(22) PCT Filed: Mar. 18, 2008

(86) PCT No.: PCT/JP2008/000634
§ 371 (c)(1),
(2), (4) Date: Dec. 17, 2009

(87) PCT Pub. No.: WO2008/114509
PCT Pub. Date: Sep. 25, 2008

(65) Prior Publication Data
US 2010/0090737 A1    Apr. 15, 2010

(30) Foreign Application Priority Data
Mar. 20, 2007    (JP) .................................. 2007-073227

(51) Int. Cl.
*H03D 3/18*    (2006.01)
*H03D 3/24*    (2006.01)

(52) U.S. Cl.
USPC ........... 375/327; 375/316; 375/326; 375/373; 375/376

(58) Field of Classification Search
USPC .......................... 375/327, 326, 316, 373, 376
See application file for complete search history.

(56) References Cited

U.S. PATENT DOCUMENTS

| 2001/0050585 | A1* | 12/2001 | Carr | 327/277 |
| 2002/0075980 | A1 | 6/2002 | Tang et al. | |
| 2002/0097073 | A1 | 7/2002 | Yang et al. | |
| 2003/0169836 | A1 | 9/2003 | Ebuchi et al. | |
| 2006/0034394 | A1* | 2/2006 | Popescu et al. | 375/326 |
| 2007/0110148 | A1* | 5/2007 | Momtaz et al. | 375/232 |
| 2008/0122546 | A1* | 5/2008 | Shiramizu et al. | 331/34 |

FOREIGN PATENT DOCUMENTS

| JP | 02-062983 | 3/1990 |
| JP | 10-050001 | 2/1998 |
| JP | 11-355262 | 12/1999 |
| JP | 2000-183731 | 6/2000 |
| JP | 2007-017257 | 1/2007 |

OTHER PUBLICATIONS

Office Action issued for related Taiwanese Patent Application No. 097109896 dated Aug. 3, 2012 and its English translation.

* cited by examiner

*Primary Examiner* — Ted Wang
(74) *Attorney, Agent, or Firm* — Ladas & Parry, LLP

(57) ABSTRACT

A change-point detection circuit 16 extracts a clock signal from serial data, input data. A variable delay circuit provides a delay in accordance with a delay control signal to a reference signal having a predetermined frequency, so that the phase of the reference signal is shifted on the basis of an initial delay. An input latch circuit latches internal serial data by using an output signal of the variable delay circuit as a strobe signal. A phase comparator matches the frequencies of the clock signal and the strobe signal with each other, and generates phase difference data in accordance with a phase difference between the two signals. A loop filter integrates the phase difference data generated by the phase comparator and outputs it as the delay control signal. The phase shift amount acquisition unit acquires a phase shift amount based on the delay control signal, the phase shift amount being based on the initial delay provided to the reference signal by the variable delay circuit.

9 Claims, 3 Drawing Sheets

CLOCK DATA RECOVERY CIRCUIT AND METHOD

1. FIELD OF THE INVENTION

The present invention relates to a clock data recovery technique in which bit stream data is regenerated by using a strobe signal.

2. DESCRIPTION OF THE RELATED ART

In order to transmit/receive data between semiconductor circuits through a small number of data transmission wires, serial data transmission is used. For the serial data transmission, a CDR (Clock and Data Recovery) method or a source synchronous method is used. In the CDR method, serial data is encoded by using the 8B10B encoding or the 4B5B encoding so as not to take the same value continuously over a predetermined period, and a clock signal for synchronization is embedded in the serial data.

When a semiconductor circuit outputting serial data is tested as a DUT (Device Under Test), a CDR circuit is provided in the input stage of a semiconductor test apparatus (also simply referred to as a test apparatus). The CDR circuit extracts from the serial data a clock signal, which is a reference signal, and generates a strobe signal based on the clock signal to latch each bit data of the serial data. The test apparatus determines whether the DUT is good by comparing the regenerated data with an expected value that the data should take. Patent Documents 1 and 2 disclose related arts.

For example, Patent Document 2 discloses the CDR circuit using a PLL (Phase Locked Loop) circuit. In the circuit, an oscillating frequency of an voltage-controlled oscillator is controlled by feedback such that a phase of the clock signal associated with the serial data and a phase of the strobe signal generated based on the clock signal, are matched with each other. As a result, the phase of the strobe signal can be adjusted following a jitter of the serial data.

[Patent Document 1] Japanese Patent Application Publication No. Hei 2-62983

[Patent Document 2] Japanese Patent Application Publication No. 2007-17257

The present applicant has examined the CDR circuit for the purpose of realizing a function of measuring and tracking a jitter amount of the serial data. However, the applicant has recognized a problem that, if the CDR circuit employing the PLL circuit is used, the frequency of the strobe signal is adjusted, and hence phase information thereof cannot be accurately acquired and the jitter amount that the serial data has cannot be estimated.

SUMMARY OF THE INVENTION

The present invention has been made in view of the foregoing problem, and a purpose of the invention is to provide a clock data recovery technique in which the jitter amount of inputted bit stream data can be measured.

An embodiment of the present invention relates to a clock data recovery circuit that generates a strobe signal based on a clock signal associated with input data to receive the input data. The clock data recovery circuit comprises: a variable delay circuit that provides an initial delay and a shift delay corresponding to a delay control signal, to a reference signal having a predetermined frequency such that a phase of the reference signal is shifted on the basis of the initial delay; a latch circuit that latches each bit data included in the input data by using an output signal of the variable delay circuit as a strobe signal; a phase comparator that matches frequencies of the clock signal and the output signal of the variable delay circuit with each other, and generates phase difference data in accordance with a phase difference between the two signals, the frequencies of which are matched with each other; a loop filter that performs filtering on the phase difference data generated by the phase comparator and outputs the filtered data to the variable delay circuit as the delay control signal; and a phase shift amount acquisition unit that acquires the shift delay provided to the reference signal by the variable delay circuit, by cumulatively monitoring the delay control signal.

Because a shift delay amount provided to the reference signal is dependent on the delay control signal, a phase shift amount from an initial state can be acquired by cumulatively monitoring the delay control signal. Herein, the shift delay is adjusted by feedback following the input data. Accordingly, according to the embodiment, a jitter amount of the input data (hereinafter, also referred to as a drift amount) can be estimated by acquiring the shift delay.

The variable delay circuit may reduce an absolute value of the shift delay by an integral multiple of a unit interval of serial data, when the absolute value thereof reaches the integral multiple of the unit interval.

As the jitter of the data to be inputted becomes large, the phase shift amount provided to the reference signal becomes large accordingly, and hence there could occur a situation in which the phase shift amount may exceed an upper limit of the delay amount that can be added by the variable delay circuit. Reduction in the absolute value of the shift delay is equivalent to the fact that the phase shift amount provided to the reference signal is varied so as to approach the initial delay. Therefore, according to the embodiment, the shift delay can follow a large jitter without being limited by the upper limit of the delay amount of the variable delay circuit.

As a result of phase comparison, the delay control signal may take a first state indicating that the phase of the clock signal is advanced or a second state indicating that the phase thereof is delayed. The variable delay circuit may reduce the shift delay by a unit period specified by dividing the unit interval by an integer when the delay control signal is in the first state, while may increase the shift delay by the unit period, when the delay control signal is in the second state. In this case, the phase shift amount acquisition unit may include: an up-down counter that counts up or down in accordance with the state of the delay control signal; and a unit interval shift monitor that detects that a cumulative amount of the shift delay reaches the unit interval by comparing a count value of the up-down counter with a predetermined value. Further, the delay control signal may take a third state indicating that there is not any phase difference between the delay control signal and the clock signal. When in the third state, the variable delay circuit may keep a current delay amount.

The unit interval shift monitor may compare the count value with the predetermined value by monitoring a carry or a borrow in the up-down counter.

The variable delay circuit may include a buffer chain circuit. In this case, the delay can be discretely switched by controlling the number of inverters connected together in series.

The variable delay circuit may include a four-quadrant mixer circuit in which the reference signal and a signal obtained by shifting the phase of the reference signal by 90° are respectively set as an in-phase component (I component) and a quadrature component (Q component), and the delay control signal is subjected to quadrature modulation as a modulation signal. In this case, the reference signal can be rotated on the IQ plane to provide an optional argument, by varying amplitudes of the I component and Q component in accordance with the delay control signal, allowing the delay to be varied.

Another embodiment of the present invention relates to a test apparatus. The apparatus comprises anyone of the clock data recovery circuits stated above, which is used for receiving the serial data outputted from the DUT. According to the embodiment, the jitter amount of the data outputted from the DUT can be measured.

The test apparatus may further comprise an expected value generation unit that generates an expected value that output data of the latch circuit in the clock data recovery circuit should take, and a decision unit that compares the expected value with the output data of the latch circuit. The expected value generation unit may shift the expected value by one bit in terms of time when detecting that the phase shift amount reaches the unit interval. In this case, even if data to be inputted to the test apparatus is shifted exceeding the unit interval, the decision unit can compare corresponding data items with each other by shifting the expected value in accordance with the data to be inputted.

Yet another embodiment of the present invention relates to a clock data recovery method in which a strobe signal is generated based on a clock signal associated with input data to receive the input data. The method comprises: providing a phase shift to a reference signal having a predetermined frequency by feedback such that the phase thereof is matched with that of the clock signal; latching each bit data included in the input data by using the reference signal provided with the phase shift as a strobe signal; and acquiring cumulatively the phase shift provided to the reference signal. According to the embodiment, a drift amount of the input data can be acquired as a cumulative value of the phase shift.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
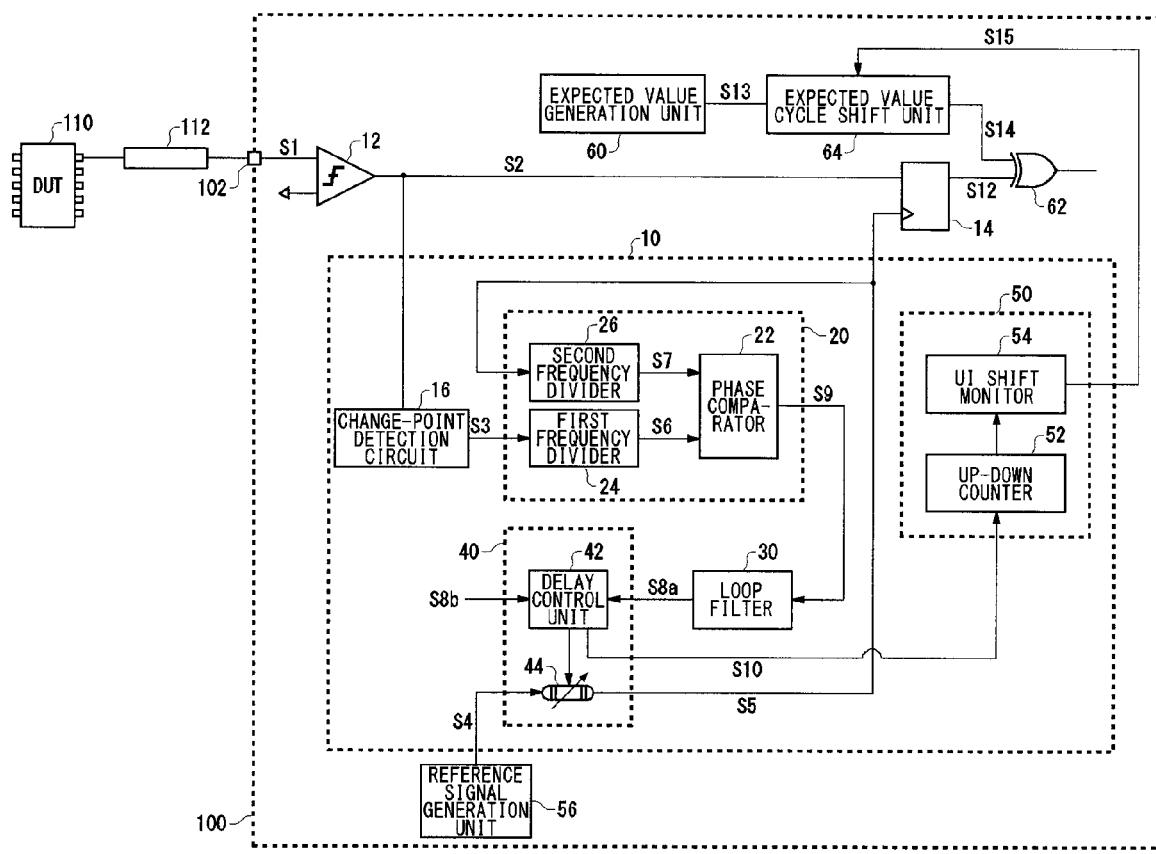
FIG. 1 is a block diagram illustrating a structure of a test apparatus using a clock data recovery circuit according to an embodiment of the present invention.

The present invention will now be described based on preferred embodiments with reference to the accompanying drawings. The same or equivalent constituents, member, or processes illustrated in each drawing will be denoted with the same reference numerals, and the duplicative descriptions thereof are appropriately omitted. The preferred embodiments do not intend to limit the scope of the invention but exemplify the invention. All of the features and the combinations thereof described in the embodiments are not necessarily essential to the invention.

FIG. 1 is a block diagram illustrating a structure of a test apparatus 100 using a clock data recovery circuit 10 according to an embodiment of the present invention. The test apparatus 100 receives serial data S1 outputted from a DUT 110 connected thereto through a transmission path 112, and inspects the DUT 110 by comparing the data S1 with expected value data S13.

Outline of the whole structure of the test apparatus 100 will be described at first. The test apparatus 100 comprises a clock data recovery circuit 10, a comparator 12, an input latch circuit 14, a reference signal generation unit 56, an expected value generation unit 60, a decision unit 62, and an expected value cycle shift unit 64. The clock data recovery circuit 10 provided as an input circuit for the test apparatus 100 generates a strobe signal S5 based on serial data S1 inputted to an input terminal 102. The reference signal generation unit 56 generates a reference signal S4 that becomes necessary when the clock data recovery circuit 10 generates the strobe signal S5.

The comparator 12 compares a voltage level of the serial data S1 with a predetermined slice level, and generates data taking a high-level or a low-level (hereinafter, referred to as internal serial data S2). The input latch circuit 14 is structured by, for example, a flip-flop and a latch circuit. The input latch circuit 14 latches the internal serial data S2 by using the strobe signal S5 generated by the clock data recovery circuit 10, and synchronizes the data S2 with an internal clock in the test apparatus 100.

The expected value generation unit 60 generates expected value data S13 that should be taken by output data S12 sequentially outputted from the input latch circuit 14. The decision unit 62 compares the data S12 latched by the input latch circuit 14 with the expected value data S13, and measures an error rate, etc., or determines whether the DUT 110 is good. The expected value cycle shift unit 64 provided between the expected value generation unit 60 and the decision unit 62 will be described below. FIG. 1 illustrates the decision unit 62 as an XOR (eXclusive OR) gate; however, the decision unit 62 can be structured by another circuit element by which bit comparison can be executed.

Outline of the whole structure of the test apparatus 100 has been described above. The test apparatus 100 is used as follows: The DUT 110 is mounted on a socket or the like to be connected to the test apparatus 100. A test pattern in a serial form is generated from the DUT 110. The test pattern is data to be matched with the expected value data S13. The clock data recovery circuit 10 in the test apparatus 100 receives the serial data outputted from the DUT 110 to latch the data by the strobe signal, and determines whether the DUT 110 is good by comparing each bit data with the expected value data.

Hereinafter, the structure of the clock data recovery circuit 10 provided as an input circuit will be described in detail. The serial data S1 to be inputted to the test apparatus 100 is affected by the inside of the DUT 110 or the transmission path 112, and hence has a jitter. The clock data recovery circuit 10 has a function of generating the strobe signal S5 following the jitter of the serial data S1.

The clock data recovery circuit 10 comprises a change-point detection circuit 16, a phase comparison unit 20, a loop filter 30, a variable delay circuit 40, and a phase shift amount acquisition unit 50. The phase comparison unit 20, the loop filter 30 and the variable delay circuit 40 structure a so-called DLL (Delay Locked Loop) circuit.

The change-point detection circuit 16 extracts a clock signal S3 from the internal serial data S2. For example, when the serial data S1 is encoded in 8B10B format, the change-point detection circuit 16 extracts the clock signal S3 embedded in the serial data S1 based on an edge occurring in the serial data S1. The change-point detection circuit 16 is realized by adopting a known technique, and hence detailed descriptions thereof will be omitted.

The reference signal generation unit 56 generates a reference signal S4 having a predetermined frequency. The frequency of the reference signal S4 is set such that the frequency of the strobe signal S5 finally generated by the clock data recovery circuit 10 is matched with the bit rate of the serial data S1. In the present embodiment, the case where the frequency of the reference signal S4 and that of the strobe signal S5 are equal to each other, will be described.

To the variable delay circuit 40, are inputted a delay control signal S8a generated by the loop filter 30, which will be described below, and an initial delay set signal S8b for setting an initial delay. The variable delay circuit 40 provides a shift delay to the reference signal S4 in accordance with the initial delay and the delay control signal, so that the phase of the reference signal S4 is shifted on the basis of the initial delay. That is, the delay amount provided to the reference signal S4 is defined by synthesis of the initial delay according to the initial delay set signal S8b and the shift delay according to the delay control signal S8a. When the shift delay according to the delay control signal S8a is negative, it is meant that the phase of the reference signal S4 is more advanced than the initial delay.

To realize the function, the variable delay circuit 40 in FIG. 1 includes a delay control unit 42 and a variable delay element 44. The variable delay element 44 receives the reference signal S4, and outputs the signal S4 after providing an delay amount commanded by the delay control unit 42. An output of the variable delay element 44 is supplied to the input latch circuit 14 as the strobe signal S5.

For example, the variable delay element 44 may be structured by a buffer chain circuit including a plurality of unit delay elements connected together in cascade, for example, a plurality of inverters, and a switch bypassing each delay element. In this case, the number of inverters through which the reference signal S4 passes is controlled in accordance with switching on/off of the bypass switch, allowing the delay amount to be adjusted. The delay control unit 42 controls the switching on/off in accordance with the delay amount to be provided to the reference signal S4, based on the delay control signal S8a and the initial delay set signal S8b. Hereinafter, the unit of a delay adjustment width of the variable delay element 44 is denoted by $\Delta t$.

The strobe signal S5 outputted from the variable delay circuit 40 is inputted to the phase comparison unit 20 as well as the input latch circuit 14. The phase comparison unit 20 matches the frequency of the clock signal S3 extracted by the change-point detection circuit 16 and that of the strobe signal S5 outputted from the variable delay circuit 40, with each other. The phase comparison unit 20 generates phase difference data S9 in accordance with a phase difference between the two signals, the frequencies of which are matched with each other.

To realize this function, the phase comparison unit 20 includes a phase comparator 22, a first frequency divider 24 and a second frequency divider 26. The first frequency divider 24 and the second frequency divider 26 respectively frequency divide the clock signal S3 and the strobe signal S5 at a first and a second frequency dividing ratios, so that a frequency division clock signal S6 and a frequency division strobe signal S5 are generated. The phase comparator 22 compares the phases of the frequency division clock signal S6 and the frequency division strobe signal S7, the frequencies of which are equal to each other, and generates the phase difference data S9 in accordance with the phase difference.

The frequency division ratios of the first frequency divider 24 and the second frequency divider 26 may be set in accordance with a resolution capability for phase comparison by the phase comparator 22, and there are sometimes cases where the first frequency divider 24 or the second frequency divider 26 is not necessary.

The loop filter 30 is, for example, a low-pass filter, which integrates the phase difference data S9 generated by the phase comparison unit 20 and outputs it to the variable delay circuit 40 as the delay control signal S8a.

The phase of the strobe signal S5 is adjusted by the DLL circuit so as to follow that of the clock signal S3, allowing each bit of the serial data S1 to be latched. The clock data recovery circuit 10 according to the present embodiment comprises the phase shift amount acquisition unit 50 in addition to the DLL circuit. The phase shift amount acquisition unit 50 acquires the delay shift, which is provided to the reference signal S4 by the variable delay circuit 40, by cumulatively monitoring the delay control signal S8a.

Figure 2A:
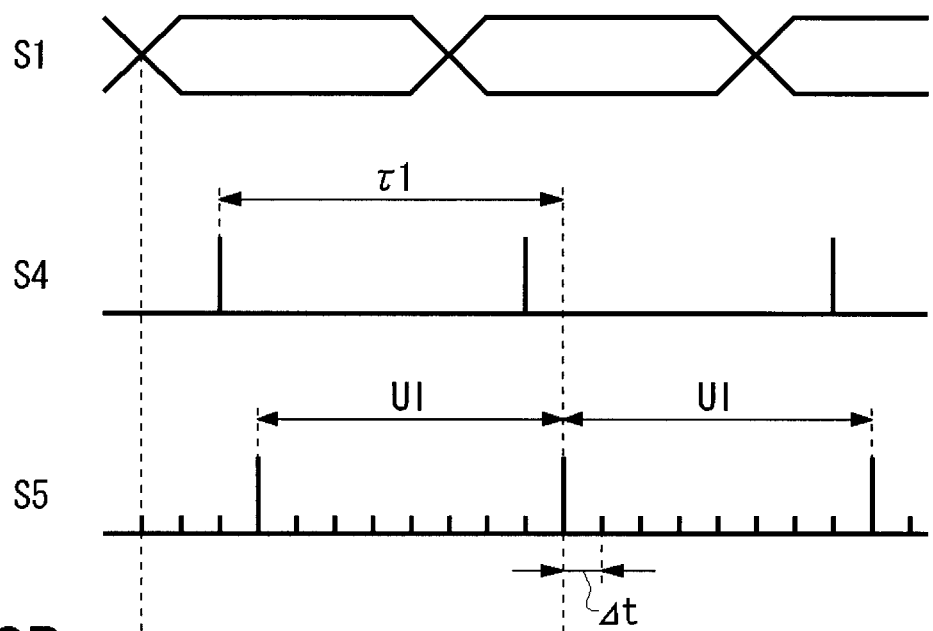
FIGS. 2A and 2B are time charts illustrating serial data, a reference signal and a strobe signal.
Figure 2B:
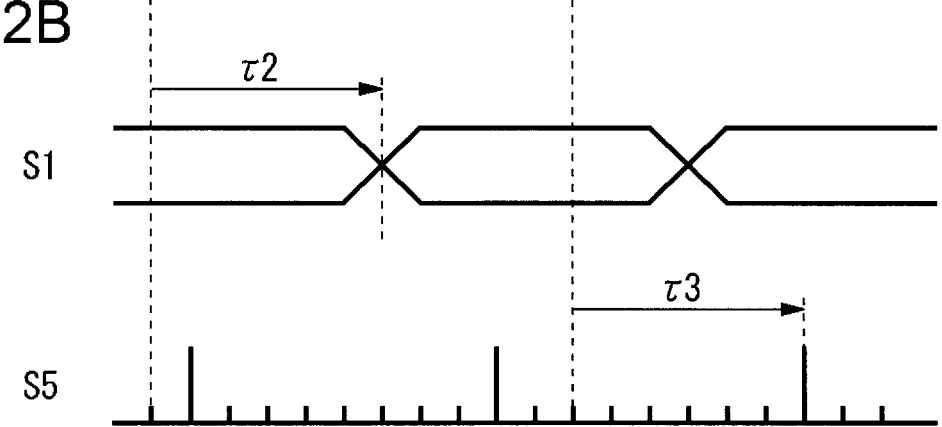

Operation of the clock data recovery circuit 10 structured as stated above will be described. FIGS. 2A and 2B are time charts illustrating the serial data S1, the reference signal S4 and the strobe signal S5. FIG. 2A illustrates an initial state, while FIG. 2B illustrates a state after a lapse of a certain period from the initial state. In the following drawings, the vertical axes and the horizontal axes thereof are appropriately enlarged or reduced for better viewability and easy understanding, and therefore illustrated differently from actual scales thereof.

In the initial state, the reference signal S4 is provided with an initial delay $\tau 1$ by the delay control unit 42. Accordingly, the strobe signal S5 is delayed from the reference signal S4 by the initial delay $\tau 1$. The initial delay $\tau 1$ is set in consideration of a set up time and a hold time of the input latch circuit 14.

FIG. 2B illustrates a state in which the serial data S1 drifts into the direction of being delayed from the initial state by a time $\tau 2$ due to influence of the jitter of the serial data S1. It is noted that the reference signal S4 is not influenced by the jitter of the serial data S1 and any phase shift is not generated, and hence the reference signal S4 is not illustrated in FIG. 2B. When the serial data S1 drifts, the clock signal S3 extracted by the change-point detection circuit 16 also drifts by the same time $\tau 2$. As stated above, the variable delay circuit 40 provides, to the reference signal S4, a shift delay $\tau 3$ in accordance with the delay control signal S8a, in addition to the initial delay $\tau 1$; and shifts the phase of the reference signal S4 on the basis of the initial delay $\tau 1$.

In the clock data recovery circuit 10, feedback is performed such that a phase difference between the frequency division clock signal S6 and the frequency division strobe signal S7, which respectively correspond to the clock signal S3 and the strobe signal S5, becomes a minimum, causing the shift delay $\tau 3$ to follow the drift time $\tau 2$. That is, even if the serial data S1 has the jitter, the strobe signal S5 following the serial data S1 can be generated, allowing each bit data of the serial data S1 to be latched.

From the aforementioned descriptions, a first advantage of the clock data recovery circuit 10 in FIG. 1 becomes clear. The phase of the clock signal S3 extracted by the change-point detection circuit 16 is varied in accordance with the jitter of the serial data S1. Also, the phase of the reference signal S4 is adjusted so as to follow a variation in the phase of the clock signal S3. That is, the shift delay τ3 provided to the reference signal S4 becomes data indicating the jitter amount (drift time) τ2 that the serial data S1 has. Herein, because the shift delay τ3 becomes data in accordance with a cumulative value of the delay control signal S8a, the jitter amount of the serial data S1 can be measured by using the clock data recovery circuit 10 according to the present embodiment.

Subsequently, a reset operation executed by the phase shift amount acquisition unit 50 and the variable delay circuit 40 will be described.

As stated above, the phase shift amount acquisition unit 50 monitors the shift delay τ3 provided to the reference signal S4 on the basis of the initial delay τ1. The phase shift amount acquisition unit 50 detects that the shift delay τ3 reaches a value obtained by multiplying a unit interval UI by an integer n, the unit interval UI being defined by a reciprocal of the bit rate of the serial data S1.

The variable delay circuit 40 varies the phase shift amount provided to the reference signal S4 such that the phase shift amount approaches the initial delay τ1 by an integral m multiple of the unit interval UI, when an absolute value of the shift delay τ3 on the basis of the initial delay τ1, reaches an integral n multiple of the unit interval UI. That is, the absolute value of the shift delay τ3 is reduced by an integral multiple of the unit interval UI. This operation is referred to as a reset operation. It is noted that m may or may not be equal to n.

For example, when n=m=1 and when the shift delay τ3 becomes the unit interval UI, the reset operation is executed in which a delay provided to the reference signal S4 becomes the initial delay τ1, with the shift delay τ3 being 0. When m=2, n=1 and when the shift delay τ3 becomes −2×UI, the shift delay τ3 is set to −UI through the reset operation. The case where m=n holds means that the shift delay τ3 becomes 0 through the reset operation, and hence the phase after the reset operation is set to the initial delay τ1.

Second advantage can be realized by the reset operation. For example, when the variable delay element 44 is structured by the buffer chain circuit, a delay amount, which can be added to the reference signal S4, is limited in accordance with the number of the inverters to be connected. For example, when the delay amount that can be added by the variable delay element 44 is ±UI on the basis of the initial delay τ1, the jitter amount (also referred to as a jitter tolerance) of the serial data S1, which can be followed by the clock data recovery circuit 10, becomes ±UI.

When the absolute value of the shift delay τ3 on the basis of the initial delay τ1 reaches the unit interval UI, the clock data recovery circuit 10 according to the present embodiment resets the shift delay τ3 to the initial delay τ1. Accordingly, the jitter tolerance of the serial data S1 can be a substantially infinite value, without being limited by a range of the delay amount by the variable delay element 44.

The jitter tolerance required of the test apparatus 100 is specified dependently on a jitter frequency, that is, as the jitter frequency is smaller, the larger jitter tolerance is required. For example, with respect to the jitter frequency of less than or equal to 100 Hz, the jitter tolerance of more than 10 UI is sometimes required. Because the jitter tolerance realized by a clock data recovery circuit using a conventional PLL circuit has at most several UI, the clock data recovery circuit cannot be used in such an application. In contrast, the clock data recovery circuit 10 according to the present embodiment can be preferably used for an application in which the large jitter tolerance is required. Further, when the DUT 110 is a device used for ultra-long distance transmission such as intercontinental communication, the clock data recovery circuit 10 according to the present embodiment can be preferably employed for an application in which the jitter tolerance of tens to hundreds UI is required.

Subsequently, an structural example and operation of the phase shift amount acquisition unit 50 will be described below. In the present embodiment, the delay control signal S8a takes a first state indicating that the phase of the frequency division clock signal S6 is advanced relative to the frequency division strobe signal S7, and a second state indicating that the phase thereof is delayed relative thereto.

When the delay control signal S8a is in the first state, the variable delay circuit 40 reduces the delay amount provided to the reference signal S4 by a unit period Δt obtained by dividing the unit interval UI by an integer. The Δt corresponds to a unit adjustment amount of the delay in the variable delay element 44. In contrast, when the delay control signal S8a is in the second state, the variable delay circuit 40 increases the delay provided to the reference signal S4 by the unit period Δt. The delay control signal S8a may take a third state indicating that the phases of the frequency division clock signal S6 and the frequency division strobe signal S7 are matched with each other. When the delay control signal S8a takes the third state, the current delay amount is kept without varying the delay provided to the reference signal S4. When the third state is provided for the delay control signal S8a, it can be suppressed that the delay amount fluctuates in a high frequency wave in a state where the phase difference is 0, resulting in an advantage in terms of noise reduction.

The phase shift amount acquisition unit 50 includes an up-down counter 52 and a UI shift monitor 54. Data S10 outputted from the delay control unit 42 indicates a state of the delay control signal S8a. The up-down counter 52 counts up or down in accordance with the data S10. That is, a count value of the up-down counter 52 becomes data indicating the shift delay τ3 relative to the initial delay τ1.

The UI shift monitor 54 detects that the shift delay τ3 reaches the unit interval UI by comparing the count value of the up-down counter 52 with a predetermined value. For example, the UI shift monitor 54 may compare the counter value with the predetermined value by monitoring a carry or a borrow in the up-down counter 52. That is, either one of count-up and count-down occurs more often, the carry or borrow occurs in the up-down counter 52. Accordingly, by appropriately setting the bit value of the counter, it can be detected, as occurrence of the carry or the borrow, that the shift delay τ3 reaches the unit interval UI.

The UI shift monitor 54 may be structured by a counter that counts up or down in accordance with the carry or the borrow. In this case, a count value of the UI shift monitor 54 becomes data indicating the jitter corresponding to how many times of the UI has cumulatively occurred since the initial state, allowing the data to be effectively used inside the test apparatus 100. For example, the test apparatus 100 may finish inspection for the DUT 110 based on the data.

The expected value cycle shift unit 64 is provided between the expected value generation unit 60 and the decision unit 62. The expected value cycle shift unit 64 shifts the inputted expected value data S13 by a required number of bits in terms of time. For example, the expected value cycle shift unit 64 may be structured by a shift register or a barrel shifter. When the absolute value of the shift delay τ3 reaches the unit interval UI, the phase shift amount acquisition unit 50 communicates with the expected value cycle shift unit 64 by control data S15. After receiving the control signal S15, the expected value cycle shift unit 64 shifts the expected value data S13 by one bit in terms of time. With this, an expected value S14 following the jitter of the serial data S1 can be supplied to the decision unit 62. If the UI shift monitor 54 is structured by a counter, a shift amount of the expected value data S13 provided by the expected value cycle shift unit 64 may be coupled with a count value of the UI shift monitor 54.

The structure and operation of the clock data recovery circuit 10 according to the embodiment have been described above. According to the clock data recovery circuit 10 in FIG. 1, the jitter amount of the serial data S1 can be measured by using the DLL circuit instead of the PLL circuit, and further by providing the phase shift amount acquisition unit 50 that monitors the delay amount.

When the jitter amount measured by the phase shift amount acquisition unit 50, i.e., the shift delay τ3 provided to the reference signal S4, is shifted by a predetermined amount, an integral multiple of the unit interval on the basis of the initial delay τ1, the clock data recovery circuit 10 resets the delay amount of the variable delay element 44. With this, limitation of the jitter tolerance by the variable delay element 44 can be eliminated.

The aforementioned embodiments are intended to be illustrative only. It will be appreciated by those skilled in the art that various modifications to the constituting elements and processes could be developed and that such modifications are within the scope of the present invention. Hereinafter, such modifications will be described.

Figure 3B:
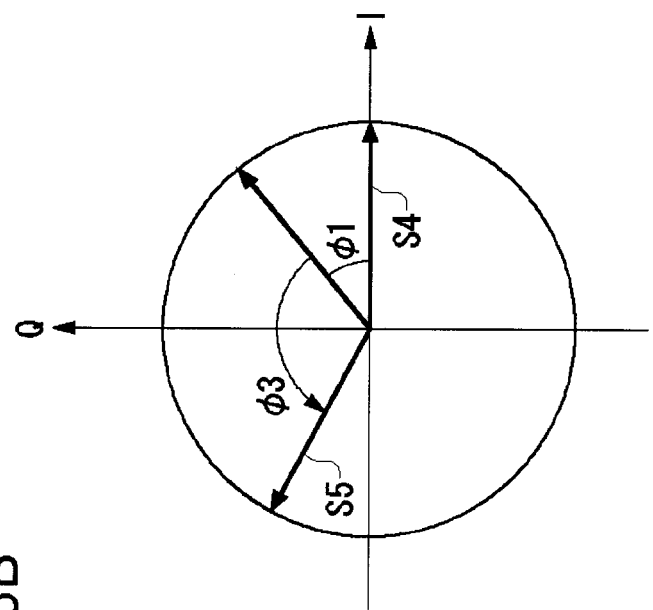
FIGS. 3A and 3B are, respectively, a circuit diagram of a variable delay element in a clock data recovery circuit according to a variation, and an IQ plane diagram illustrating operation thereof.
Figure 3A:
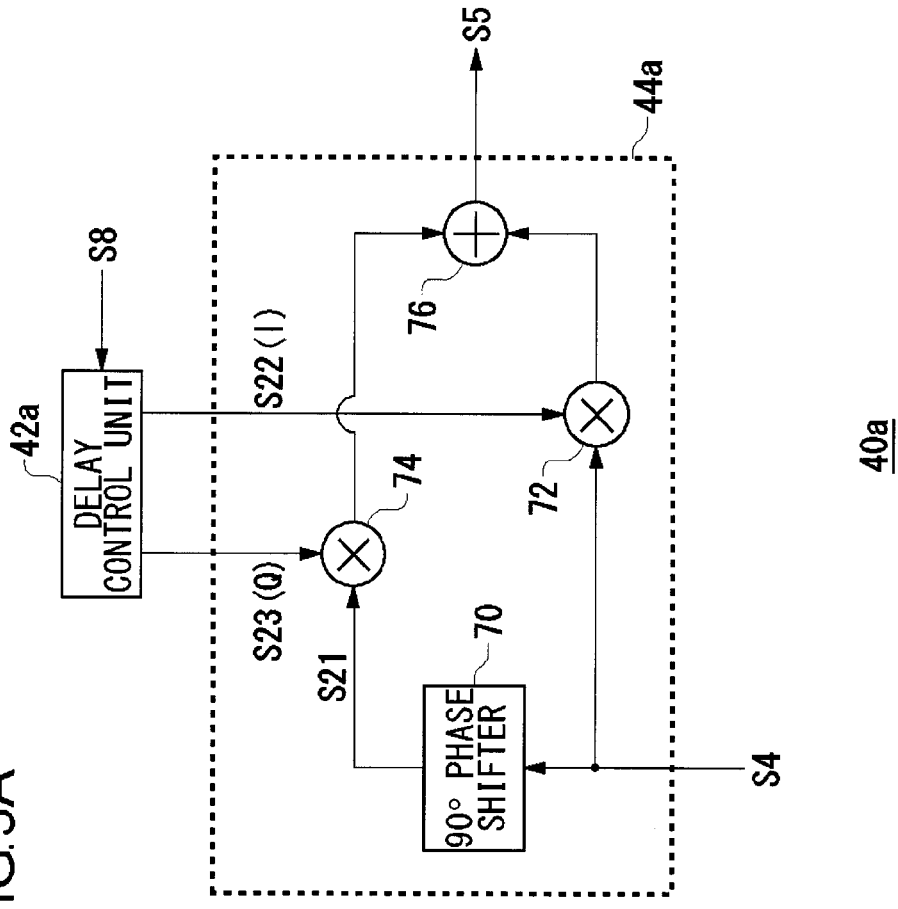

FIGS. 3A and 3B are, respectively, a circuit diagram of a variable delay element 44a in a clock data recovery circuit according to a variation, and an IQ plane diagram illustrating operation thereof. The variable delay element 44a is a four-quadrant mixer circuit including a 90° phase shifter 70, a first mixer circuit 72, a second mixer circuit 74, and an adder 76.

The 90° phase shifter 70 delays the phase of the reference signal S4 by 90°. φ1 in FIG. 3B corresponds to the initial delay τ1, while φ3 to the shift delay τ3 on the basis of the initial delay τ1. A delay control unit 42a outputs $\cos(\phi_1+\phi_3)$ as I data S22 and $\sin(\phi_1+\phi_3)$ as Q data S23. The first mixer circuit 72 multiplies the I data S22 by the reference signal S4, which is an in-phase signal, while the second mixer circuit 74 multiplies the Q data S23 by a quadrature signal S21. The adder 76 adds output signals of the first mixer circuit 72 and the second mixer circuit 74 together.

According to the variable delay circuit 40a in FIG. 3A, when an argument is rotated by 360° in a direction, φ3 returns to the initial phase φ1, and hence a substantially infinite jitter tolerance can be realized without performing the aforementioned reset operation. Further, by providing the phase shift amount acquisition unit 50, a drift amount of the serial data S1 can be measured based on the delay control signal S8a.

The clock data recovery circuit 10 in FIG. 1 or the modified example using the variable delay circuit 40a in FIG. 3A relates to a circuit in which the clock signal S3 embedded in the serial data S1 is extracted to generate the strobe signal S5. The present invention can also be applied to a source synchronous method in which the DUT transmits the serial data S1 and the clock signal, synchronized with the serial data S1, at a time.

In this case, the change-point detection circuit 16 is not necessary, and clock signal outputted in synchronized with the serial data S1 from the DUT, may be used as the clock signal S3 for the phase comparison unit 20. In the case of the source synchronous method, if there is not any variation in a relative phase difference between the serial data and the clock signal, there does not occur any transmission error theoretically. In other words, if drift amounts of the serial data and the clock signal are equal to each other, data transmission can be executed even when huge drift occurs. Accordingly, in the case of a test apparatus in which a source synchronous device is used as the DUT, very large jitter tolerance is required. The clock data recovery circuit according to the present invention, in which there is not any substantial limitation of the jitter tolerance and a jitter amount can be measured, can be preferably applied to the test apparatus 100 for inspecting the source synchronous device.

In the embodiments, the case where serial data is inputted to the clock data recovery circuit 10 has been described; however, the present invention is not limited thereto, but can be applied to the cases where various data are inputted as bit streams.

The present invention has been described based on the preferred embodiments; however, it is clear that the embodiments illustrate only the principle and applications of the invention. Accordingly, it is needless to say that various modifications or changes in the arrangement can be made to the embodiments without departing from the spirit of the invention set forth in the appended claims.

The invention claimed is:

1. A clock data recovery circuit that generates a strobe signal based on a clock signal associated with input data to receive the input data, the clock data recovery circuit comprising:

a variable delay circuit configured to receive a reference signal having a predetermined frequency, a delay control signal, and an initial delay set signal, and to provide a shift delay to the reference signal such that a phase of the reference signal is shifted on the basis of an initial delay, wherein the shift delay is a sum of the initial delay, which corresponds to the initial delay set signal, and a variable delay corresponding to the delay control signal;

a latch circuit having a first terminal and a second terminal, the latch circuit being configured to receive the input data including bit data at said first terminal, to receive an output signal of the variable delay circuit at said second terminal, and to latch each bit data included in the input data by using the output signal of the variable delay circuit as a strobe signal;

a phase comparator that matches frequencies of the clock signal and the output signal of the variable delay circuit with each other, and generates phase difference data in accordance with a phase difference between the two signals, the frequencies of which are matched with each other;

a loop filter that performs filtering on the phase difference data generated by the phase comparator so as to generate the delay control signal, wherein the delay control signal is provided to the variable delay circuit; and a phase shift amount acquisition unit configured to accumulate the delay control signal so as to acquire the shift delay provided to the reference signal according to a cumulative value of the delay control signal.

2. The clock data recovery circuit according to claim 1, wherein the variable delay circuit reduces an absolute value of the shift delay by an integral multiple of a unit interval of the input data, when the absolute value of the shift delay reaches the integral multiple of the unit interval.

3. The clock data recovery circuit according to claim 2, wherein the delay control signal takes, as a result of phase comparison, a first state indicating that the phase of the clock signal is advanced or a second state indicating that the phase of the clock signal is delayed, and wherein the variable delay circuit reduces the shift delay by a unit period specified by dividing the unit interval by an integer when the delay control signal is in the first state, while increasing the shift delay by the unit period when the delay control signal is in the second state, and wherein the phase shift amount acquisition unit includes an up-down counter that counts up or down in accordance with the state of the delay control signal, and a unit interval shift monitor that detects that a cumulative amount of the shift delay reaches the unit interval by comparing a count value of the up-down counter with a predetermined value.

4. The clock data recovery circuit according to claim 3, wherein the unit interval shift monitor compares the count value with the predetermined value by monitoring a carry or a borrow in the up-down counter.

5. The clock data recovery circuit according to claim 1, wherein the variable delay circuit includes a buffer chain circuit.

6. The clock data recovery circuit according to claim 1, wherein the variable delay circuit includes a four-quadrant mixer circuit in which the reference signal and a signal obtained by shifting the phase of the reference signal by 90[deg.] are respectively set as an in-phase component and a quadrature component, and the delay control signal is subjected to quadrature modulation as a modulation signal.

7. A test apparatus comprising the clock data recovery circuit according to claim 1, the clock data recovery circuit being operative to receive serial data outputted from a device under test.

8. The test apparatus according to claim 7 further comprising:
   an expected value generation unit that generates an expected value that output data of the latch circuit in the clock data recovery circuit should take; and
   a decision unit that compares the expected value with the output data of the latch circuit, wherein the expected value generation unit shifts the expected value by one bit in terms of time when detecting that a cumulative amount of the shift delay reaches the unit interval.

9. A test apparatus comprising:
   a clock data recovery circuit that generates a strobe signal based on a clock signal associated with input data to receive the input data, the clock data recovery circuit comprising:
      a variable delay circuit that provides an initial delay and a shift delay corresponding to a delay control signal, to a reference signal having a predetermined frequency such that a phase of the reference signal is shifted on the basis of the initial delay;
      a latch circuit that latches each bit data included in the input data by using an output signal of the variable delay circuit as a strobe signal;
      a phase comparator that matches frequencies of the clock signal and the output signal of the variable delay circuit with each other, and generates phase difference data in accordance with a phase difference between the two signals, the frequencies of which are matched with each other;
      a loop filter that performs filtering on the phase difference data generated by the phase comparator and outputs the filtered data to the variable delay circuit as the delay control signal; and
      a phase shift amount acquisition unit that acquires the shift delay provided to the reference signal by the variable delay circuit, by cumulatively monitoring the delay control signal;
   wherein the clock data recovery circuit is operative to receive serial data outputted from a device under test.

* * * * *

UNITED STATES PATENT AND TRADEMARK OFFICE
CERTIFICATE OF CORRECTION

PATENT NO. : 8,537,935 B2  Page 1 of 1
APPLICATION NO. : 12/532132
DATED : September 17, 2013
INVENTOR(S) : Watanabe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 951 days.

Signed and Sealed this
Fifteenth Day of September, 2015

Michelle K. Lee
*Director of the United States Patent and Trademark Office*